(12) United States Patent
Kim et al.

(10) Patent No.: US 6,660,570 B2
(45) Date of Patent: Dec. 9, 2003

(54) METHOD OF FABRICATING A HIGH VOLTAGE SEMICONDUCTOR DEVICE USING SIPOS

(75) Inventors: Jin-kyeong Kim, Incheon (KR); Jong-min Kim, Bucheon (KR); Kyung-wook Kim, Seoul (KR); Tae-hoon Kim, Bucheon (TW); Cheol Choi, Goyang (TW); Chang-wook Kim, Goyang (KR)

(73) Assignee: Fairchild Korea Semiconductor, Ltd., Puchon (KR)

( * ) Notice: Subject to any disclaimer, the term of this patent is extended or adjusted under 35 U.S.C. 154(b) by 0 days.

(21) Appl. No.: 10/140,181

(22) Filed: May 8, 2002

(65) Prior Publication Data

US 2002/0130330 A1 Sep. 19, 2002

Related U.S. Application Data

(62) Division of application No. 09/697,307, filed on Oct. 27, 2000.

(30) Foreign Application Priority Data

Oct. 28, 1999 (KR) ............................................. 99-47115

(51) Int. Cl.$^7$ ............................................. H01L 21/332
(52) U.S. Cl. ........................ 438/133; 438/140; 438/694; 438/723; 438/764
(58) Field of Search ........................ 438/133, 140, 438/694, 723, 764; 257/637

(56) References Cited

U.S. PATENT DOCUMENTS 4,344,985 A  *  8/1982  Goodman et al. .......... 257/644
5,060,047 A      10/1991  Jaume et al.
5,158,902 A  * 10/1992  Hanada ...................... 438/258
6,014,240 A  *  1/2000  Floyd et al. ................ 359/201
6,281,548 B1 *  8/2001  Park et al. .................. 257/335

FOREIGN PATENT DOCUMENTS

JP          11-288949      * 10/1999

* cited by examiner

Primary Examiner—Amir Zarabian
Assistant Examiner—Khanh Duong
(74) Attorney, Agent, or Firm—Rothwell, Figg, Ernst & Manbeck

(57) ABSTRACT

A high voltage semiconductor device including a semiconductor substrate on which a semi-insulating polycrystalline silicon layer is formed to alleviate electric field concentration in a field region, is disclosed. A thermal oxide layer is formed on the semi-insulating polycrystalline silicon layer to serve as a protective layer. The thermal oxide layer forms a good interface with the semi-insulating polycrystalline silicon layer compared to a wet etched oxide layer or a chemical vapor deposition (CVD) oxide layer, thereby decreasing the amount of leakage current. In addition, compared to a dual semi-insulating polycrystalline silicon layer, the thermal oxide layer exhibits a high surface protection effect and a high resistance against dielectric breakdown. It also allows a great reduction in fabrication time. In particular, the semi-insulating polycrystalline silicon layer is removed from the active region, thereby preventing the direct current (DC) gain of a device from being lowered within a low collector current range caused by the semi-insulating polycrystalline silicon layer.

11 Claims, 7 Drawing Sheets

METHOD OF FABRICATING A HIGH VOLTAGE SEMICONDUCTOR DEVICE USING SIPOS

CROSS-REFERENCE TO RELATED APPLICATION

This application is a divisional of U.S. application Ser. No. 09/697,307, filed Oct. 27, 2000, the disclosure of which is incorporated herein by reference.

BACKGROUND OF THE INVENTION

1. Field of the Invention

The present invention relates to a semiconductor device and a method for fabricating the same, and more particularly, to a high voltage semiconductor device using semi-insulating polycrystalline silicon (SIPOS) and a method for fabricating the same.

2. Description of the Related Art

As application equipment becomes larger in size and capacity, high voltage semiconductor devices having a high breakdown voltage, a high current and a fast switching speed become more important. In order to decrease power loss in a conductive state even while a large amount of current is flowing, the saturation voltage of high voltage semiconductor devices is required to be low. High voltage semiconductor devices are fundamentally required to have a characteristic of resisting a reverse high voltage applied to both ends thereof in an off-state or at the moment the device is turned off. That is, high voltage semiconductor devices are fundamentally required to have a high breakdown voltage. A variety of breakdown voltages of power semiconductor devices are required to be in a range from several tens of volts to several thousands of volts.

Generally, the breakdown voltage of a semiconductor device largely depends on a depletion region extending from a PN junction, and particularly, is greatly influenced by the curvature of the depletion region. In particular, for a planar junction, an electric field is concentrated on the edges, which have a large curvature, thereby decreasing the overall breakdown voltage. Accordingly, a number of methods have been proposed in order to obtain high breakdown voltage by preventing an electric field from being concentrated on the edge of a junction. Some of these methods include a method using a field plate, a method using a field limit ring, and a method using both of these methods. In addition, a method of forming a semi-insulating polycrystalline silicon layer on a semiconductor substrate having a planar junction has been researched and developed.

Figure 1:
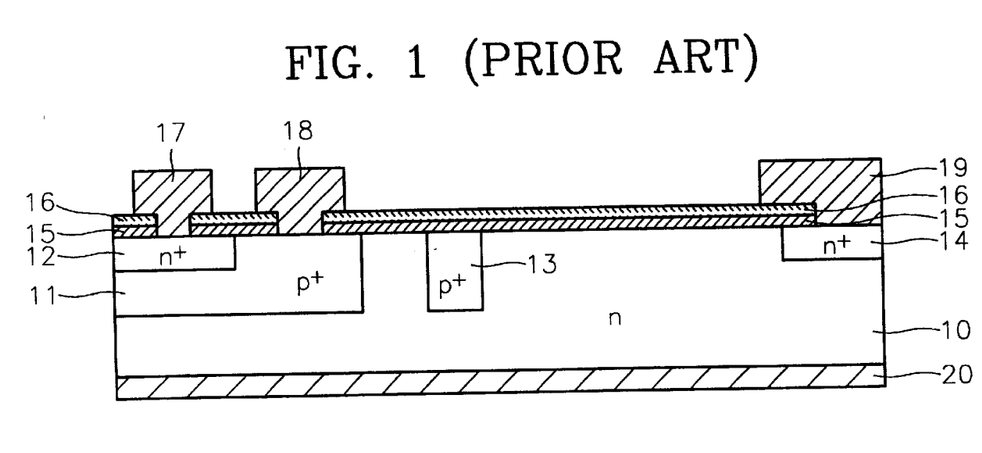
FIG. 1 is a sectional view illustrating an example of a conventional high voltage semiconductor device using semi-insulating polycrystalline silicon (SIPOS)

FIG. 1 is a sectional view illustrating an example of a conventional high voltage semiconductor device. Referring to FIG. 1, a semiconductor substrate 10 doped with first conductivity type impurities such as N-type impurities is used as a collector region. A base region 11 doped with second conductivity type impurities such as P-type impurities is formed in part of the semiconductor substrate 10. An N-type emitter region 12 is formed in a predetermined upper portion of the base region 11. A field limit ring 13 is disposed so that it is separated from the edge of the base region 11 by a predetermined distance in the semiconductor substrate 10. A channel stopper 14 doped with N-type impurities is formed in a field region separated from the field limit ring 13. The field limit ring 13 restrains an electric field from concentrating on the edge of a PN junction formed by the semiconductor substrate 10 and the base region 11. A semi-insulating polycrystalline silicon layer 15 and an oxide layer 16 deposited by chemical vapor deposition (CVD) are formed on the semiconductor substrate 10. The oxide layer 16 serves as a protective layer and may be substituted by a nitride layer. An emitter electrode 17, a base electrode 18, an equipotential electrode 19 and a collector electrode 20 are formed to be electrically connected to the emitter region 12, the base region 11, the channel stopper 14 and the semiconductor substrate 10, respectively.

High voltage semiconductor devices having such a structure have many advantages such as realization of high breakdown voltage and reduction of the area of a field region. However, the semi-insulating polycrystalline silicon layer 15 directly contacts the surface of the semiconductor substrate 10, thus increasing leakage current. In addition, the semi-insulating polycrystalline silicon layer 15 existing on the semiconductor substrate 10 between the base region 11 and the emitter region 12 in an active region decreases a direct current (DC) gain $h_{FE}$ in a low collector current range, thereby deteriorating the electrical characteristics of devices. Moreover, since the oxide (or nitride) layer 16 is formed by CVD as a protective layer, the interface between the semiconductor substrate 10 and the semi-insulating polycrystalline silicon layer 15 and the interface between the semi-insulating polycrystalline silicon layer 15 and the CVD oxide (or nitride) layer 16 are unstable. This may frequently cause dielectric breakdown.

Figure 2:
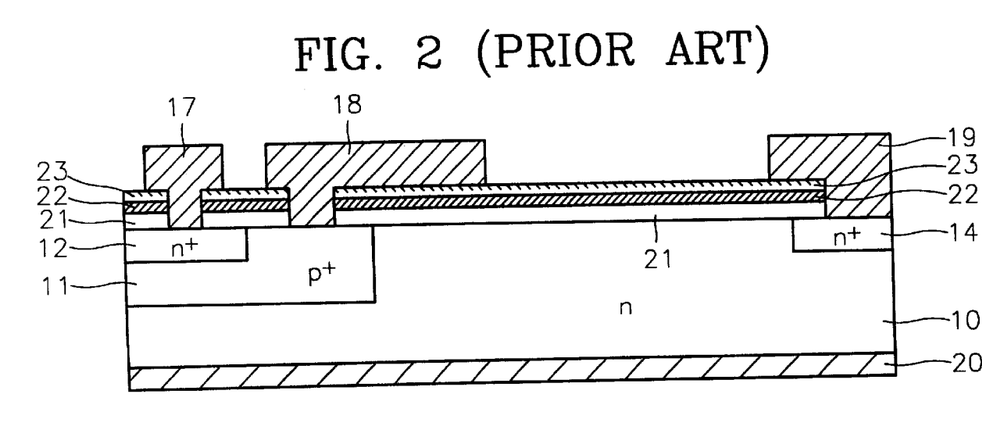
FIG. 2 is a sectional view illustrating another example of a conventional high voltage semiconductor device using SIPOS.

FIG. 2 is a sectional view illustrating another example of a conventional high voltage semiconductor device. The high voltage semiconductor device of FIG. 2 has a smaller leakage current than the high voltage semiconductor device of FIG. 1. In FIGS. 1 and 2, the same reference numerals denote the same region or member, and thus descriptions of the regions that are the same will be omitted.

Referring to FIG. 2, an oxide layer 21, a first semi-insulating polycrystalline silicon layer 22 and a second semi-insulating polycrystalline silicon layer 23 are sequentially deposited on the surface of a semiconductor substrate 10 serving as a collector region and having a base region 11, an emitter region 12 and a channel stopper 14. The oxide layer 21 restrains leakage current flowing between the first semi-insulating polycrystalline silicon layer 22 and the semiconductor substrate 10, that is, the oxide layer 21 restrains leakage current flowing over the surface of the semiconductor substrate 10. The first semi-insulating polycrystalline silicon layer 22 has an oxygen concentration of about 9%, and the second semi-insulating polycrystalline silicon layer 23 has an oxygen concentration of about 20–50%. Accordingly, the semi-insulating polycrystalline silicon layer 23 serves as a protective layer like a CVD oxide layer and shows a good interface state with the first semi-insulating polycrystalline silicon layer 22 so that dielectric breakdown can be restrained. A base electrode 18 connected to the base region 11 through a contact is formed on the second semi-insulating polycrystalline silicon layer 23 so that it extends to a field region. Accordingly, the base electrode 18 also serves as a metal field plate.

However, in a high voltage semiconductor device having such a structure, the semi-insulating polycrystalline silicon layers 22 and 23 existing on the semiconductor substrate 10 between the base region 11 and the emitter region 12 in an active region still decrease DC gain $h_{FE}$ in a low collector current range, thereby deteriorating the electrical characteristics of the device. In addition, it is difficult to understand the stacked state of the first and second semi-insulating polycrystalline silicon layers during the progress of fabrication. Moreover, it takes much time to deposit the second semi-insulating polycrystalline silicon layer 23 having a high oxygen concentration, and dry etching requiring a large amount of time and cost should be performed to pattern the second semi-insulating polycrystalline silicon layer 23.

SUMMARY OF THE INVENTION

To solve the above problems, it is a first object of the present invention to provide a high voltage semiconductor device having improved electrical characteristics and high breakdown voltage, using a semi-insulating polycrystalline silicon layer.

It is a second object of the present invention to provide a method for fabricating the high voltage semiconductor device at a low cost and in a short fabrication time.

Accordingly, to achieve the first object of the invention, there is provided a high voltage semiconductor device includes a semiconductor substrate of a first conductivity type used as a collector region, the semiconductor substrate having an active region and a field region; a base region of a second conductivity type formed in the active region of the semiconductor substrate; an emitter region of a first conductivity type formed in the base region; a channel stopper formed in the field region to be separated from the base region by a predetermined distance; an oxide layer patterned on the semiconductor substrate such that the surfaces of the emitter region, the base region and the channel stopper are partially exposed; a semi-insulating polycrystalline silicon layer formed on the oxide layer; a thermal oxide layer formed on the semi-insulating polycrystalline silicon layer; and an emitter electrode, a base electrode and a collector electrode formed to be electrically connected to the emitter region, the base region and the semiconductor substrate, respectively.

The thickness of the thermal oxide layer is 300–3000 Å. The thermal oxide layer and the semi-insulating polycrystalline silicon layer may not be formed in the active region of the semiconductor substrate, but formed only in the field region.

The base electrode may extend to the field region so that it overlaps some of the thermal oxide layer.

The high voltage semiconductor device may further includes an equipotential electrode electrically connected to the channel stopper.

There is also provided a high voltage semiconductor device including a semiconductor substrate of a first conductivity type used as a cathode region, the semiconductor substrate having an active region and a field region; an anode region of a second conductivity type formed in the active region of the semiconductor substrate; a channel stopper formed in the field region to be separated from the anode region by a predetermined distance; an oxide layer patterned on the semiconductor substrate such that the surfaces of the anode region and the channel stopper are partially exposed; a semi-insulating polycrystalline silicon layer formed on the oxide layer; a thermal oxide layer formed on the semi-insulating polycrystalline silicon layer; and an anode electrode and a cathode electrode formed to be electrically connected to the anode region and the semiconductor substrate, respectively.

The thickness of the thermal oxide layer is 300–3000 Å. The thermal oxide layer and the semi-insulating polycrystalline silicon layer may not be formed in the active region of the semiconductor substrate, but formed only in the field region.

The base electrode may extend to the field region so that it overlaps some of the thermal oxide layer.

To achieve the second object of the invention, there is provided a method for fabricating a high voltage semiconductor device, including the steps of forming an oxide layer on a semiconductor substrate of a first conductivity type used as a collector region such that the surface of the semiconductor substrate is partially exposed, the semiconductor substrate having an active region and a field region; forming a base region of a second conductivity type, using the oxide layer as an ion-implantation mask; forming an emitter region of a first conductivity type in the base region and a channel stopper of the first conductivity type in the field region to be separated from the base region by a predetermined distance, through ion-implantation; sequentially forming a semi-insulating polycrystalline silicon layer and a thermal oxide layer on the oxide layer; partially exposing the surfaces of the emitter region, the base region and the channel stopper by patterning the thermal oxide layer, the semi-insulating polycrystalline silicon layer and the oxide layer; and forming an emitter electrode, a base electrode, an equipotential electrode and a collector electrode to be electrically connected to the emitter region, the base region, the channel stopper and the semiconductor substrate, respectively.

The semi-insulating polycrystalline silicon layer is preferably formed by a low pressure chemical vapor deposition method to a thickness of about 5000 Å.

The thermal oxide layer is preferably formed by a thermal oxidation method to a thickness of 300–3000 Å. Here, in the thermal oxidation method, only oxygen gas is supplied into a tube having a temperature of about 500–1100° C. to form the thermal oxide layer.

The thermal oxide layer is preferably patterned by a wet etching method when the thermal oxide layer, the semi-insulating polycrystalline silicon layer and the oxide layer are patterned.

There is also provided a method for fabricating a high voltage semiconductor device, including the steps of forming an oxide layer on a semiconductor substrate of a first conductivity type used as a collector region such that the surface of the semiconductor substrate is partially exposed, the semiconductor substrate having an active region and a field region; forming a base region of a second conductivity type by ion-implantation; forming an emitter region of a first conductivity type in the base region and a channel stopper of the first conductivity type in the field region to be separated from the base region by a predetermined distance, using the oxide layer as an ion-implantation mask; forming a semi-insulating polycrystalline silicon layer on the oxide layer and then removing the semi-insulating polycrystalline silicon layer on the active region; forming a thermal oxide layer on the semi-insulating polycrystalline silicon layer; partially exposing the surfaces of the emitter region, the base region and the channel stopper by patterning the thermal oxide layer, the semi-insulating polycrystalline silicon layer and the oxide layer; and forming an emitter electrode, a base electrode, an equipotential electrode and a collector electrode to be electrically connected to the emitter region, the base region, the channel stopper and the semiconductor substrate, respectively.

The semi-insulating polycrystalline silicon layer is preferably formed by a low pressure chemical vapor deposition method to a thickness of less than 5000 Å.

The thermal oxide layer is preferably formed by a thermal oxidation method to a thickness of 300–3000 Å. Here, in the thermal oxidation method, only oxygen gas is supplied into a tube having a temperature of about 500–1100° C. to form the thermal oxide layer.

The thermal oxide layer is preferably patterned by a wet etching method when the thermal oxide layer, the semi-insulating polycrystalline silicon layer and the oxide layer are patterned.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE PRESENT INVENTION

Hereinafter, embodiments of the present invention will be described in detail with reference to the attached drawings. The present invention is not restricted to the following embodiments, and many variations are possible within the sprit and scope of the present invention. In the drawings, layers or regions are exaggerated for clarity. For example, even if a layer has a step difference, the step difference is not illustrated when it does not influence the characteristics of a device.

Figure 3:
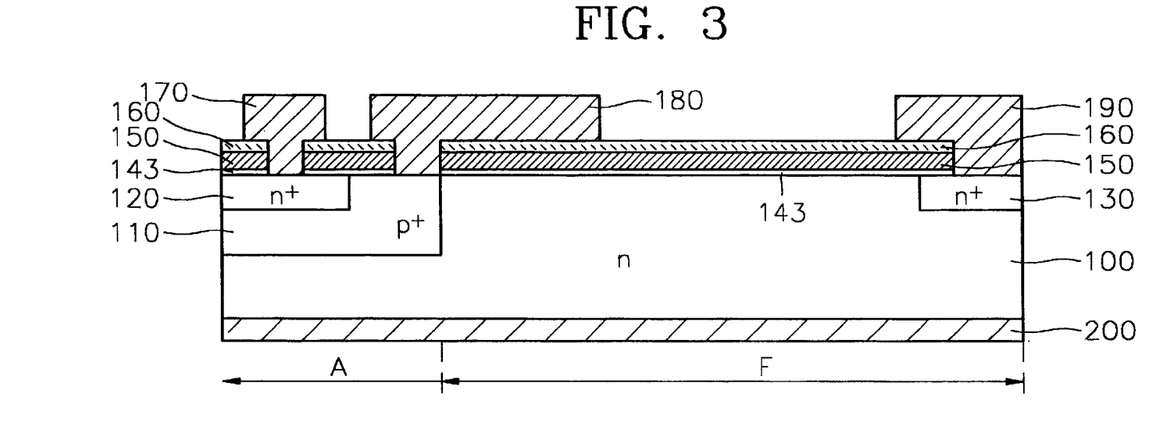
FIG. 3 is a sectional view illustrating a high voltage semiconductor device using SIPOS according to a first embodiment of the present invention.

FIG. 3 is a sectional view illustrating a high voltage semiconductor device according to a first embodiment of the present invention. Referring to FIG. 3, a semiconductor substrate 100 doped with N-type impurities is used as a collector region. The semiconductor substrate 100 includes an active region A and a field region F. A base region 110 of a second conductivity type such as a P-type is formed in the active region of the semiconductor substrate 100. An N-type emitter region 120 is formed in a predetermined upper portion of the base region 110. A channel stopper 130 doped with N-type impurities is formed in the field region F of the semiconductor substrate 100 so that it is separated from the edge of the base region 110 by a predetermined distance.

An oxide layer 143 is formed on the surface of the semiconductor substrate 100 such that it has openings partially exposing the surfaces of the base region 110, emitter region 120 and the channel stopper 130. A semi-insulating polycrystalline silicon layer 150 is formed on the oxide layer 143.

A thermal oxide layer 160 is formed as a protective layer on the semi-insulating polycrystalline silicon layer 150. The thermal oxide layer 160 is an oxide layer which is grown on the semi-insulating polycrystalline silicon layer 150 by a thermal oxidation process. Accordingly, the thermal oxide layer 160 has a higher density than a chemical vapor deposition (CVD) oxide layer and effectively serves as a surface protective layer. In addition, the state of the interface between the thermal oxide layer 160 and the semi-insulating polycrystalline silicon layer 150 is good so that dielectric breakdown is restrained, and the amount of leakage current at the interface decreases.

An emitter electrode 170, a base electrode 180, an equi-potential electrode 190 and a collector electrode 200 are formed to be electrically connected to the emitter region 120, the base region 110, the channel stopper 130 and the semiconductor substrate 100, respectively. In particular, the base electrode 180 is formed to extend over the junction between the base region 110 and the semiconductor substrate 100 to the field region F so that it also functions as a metal field plate.

Figure 4:
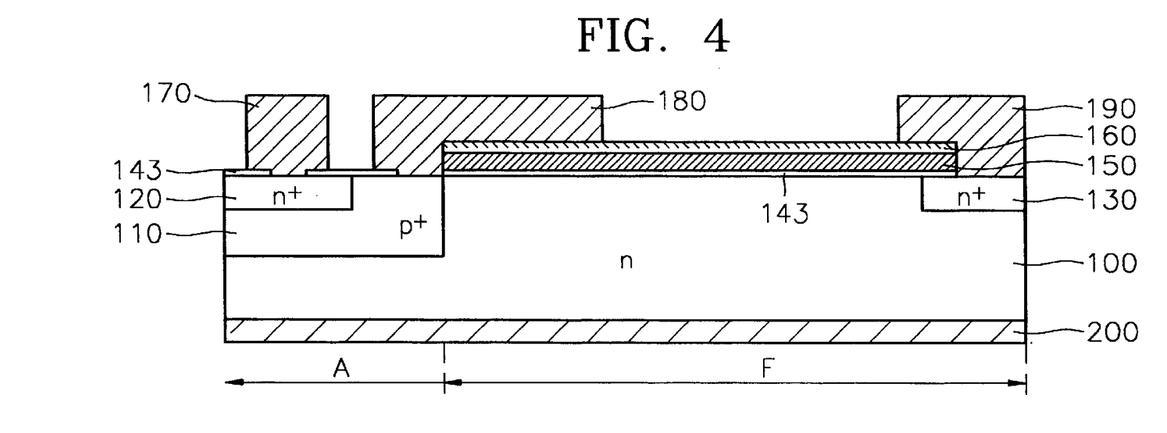
FIG. 4 is a sectional view illustrating a high voltage semiconductor device using SIPOS according to a second embodiment of the present invention.

FIG. 4 is a sectional view of a high voltage semiconductor device according to a second embodiment of the present invention. In FIGS. 3 and 4, the same reference numerals or characters denote the same region or member, and thus descriptions of the regions that are the same will be omitted.

Referring to FIG. 4, a semi-insulating polycrystalline silicon layer 150 and a thermal oxide layer 160 exist in a field region F only. Since the semi-insulating polycrystalline silicon layer 150 does not exist in the active region A, particularly, on the junction between a base region 110 and an emitter region 120, a direct current (DC) gain scarcely decreases even in a low collector current range.

An NPN power transistor has been described as an example of a high voltage semiconductor device in this specification, but it will be apparent to those skilled in the art that the present invention can be equally applied to other kinds of power semiconductor devices having a PN junction. For example, when the emitter region 120 of FIG. 3 or 4 is not formed, a PN power diode in which the semiconductor substrate 100, which acts as an N-type cathode region, and the base region 110, which acts as a P-type anode region, form a PN junction is constructed. The present invention has the same effects on such a PN power diode as described in the first and the second embodiments.

Figure 5:
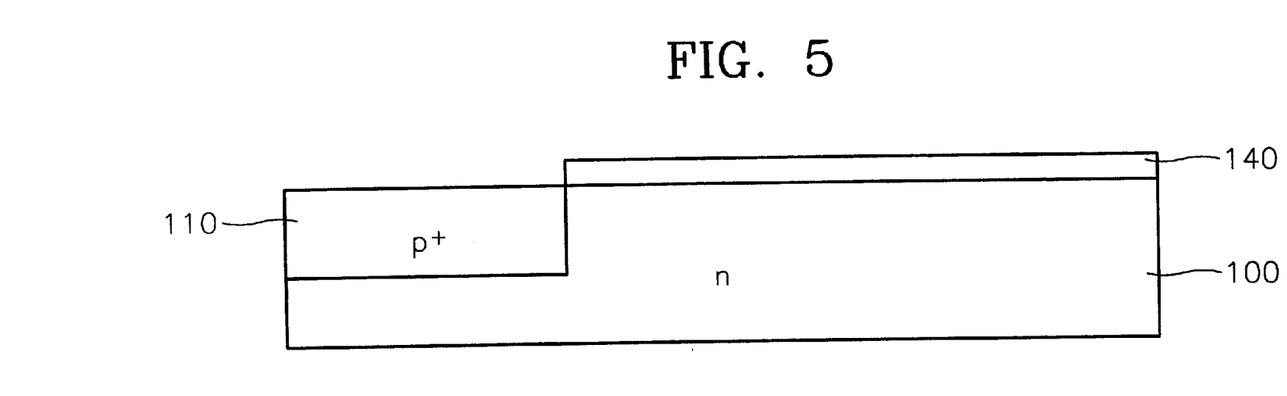
FIGS. 5 through 10 are sectional views illustrating a method for fabricating the high voltage semiconductor device using SIPOS according to the first embodiment of the present invention.
Figure 6:
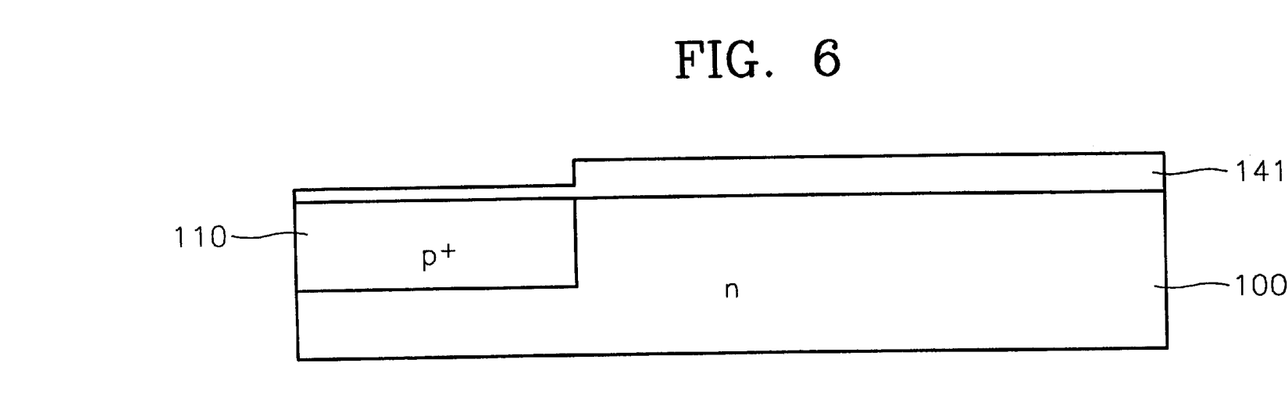

FIGS. 5 through 8 are sectional views illustrating a method for fabricating the high voltage semiconductor device according to the first embodiment. Referring to FIG. 5, an oxide layer is formed on a semiconductor substrate 100 which is doped with, for example, N-type impurities and used as a collector region. The oxide layer may be formed using a thermal oxidation method. After forming the oxide layer, a photo-etching process using a typical photolithography method is performed to pattern the oxide layer. The patterned oxide layer 140 has an opening which exposes the surface of the semiconductor substrate 100 in which a base region is to be formed. Subsequently, second conductivity type impurity ions, for example, P-type impurity ions are implanted using the patterned oxide layer 140 as an ion-implantation mask. The implanted P-type impurity ions are driven-in and diffused at a temperature of 1200–1300° C. to form the base region 110. As shown in FIG. 6, a thermal oxide layer grows on the surface of the semiconductor substrate 100 due to the drive-in diffusion process so that the oxide layer 140 used as an ion-implantation mask during the formation of the base region 110 becomes a thicker oxide layer 141. Consequently, the surface of the base region 110 is covered with the oxide layer 141.

Figure 7:
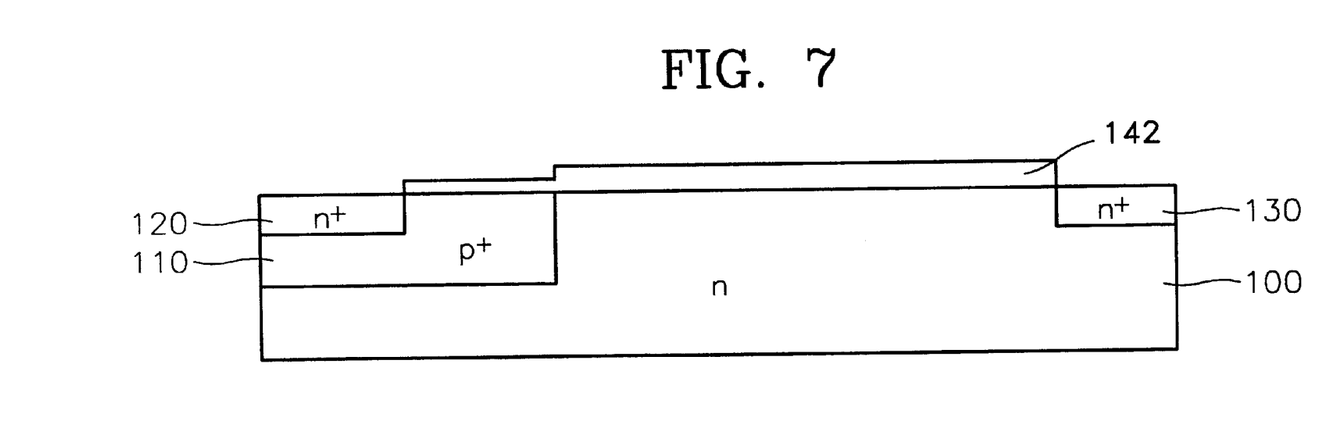
Figure 8:
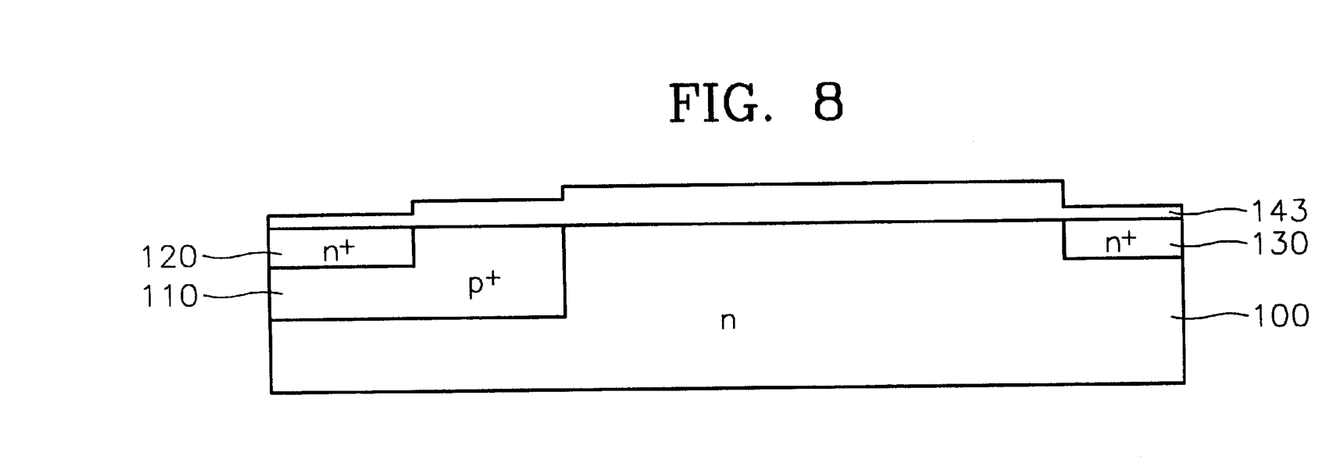

Referring to FIG. 7, the oxide layer 141 is patterned by a photo-etching process using a typical photolithography method. The patterned oxide layer 142 has openings which expose the surfaces of the semiconductor substrate 100 in which an emitter region 120 and a channel stopper 130 are to be formed. Next, N-type impurity ions are implanted using the patterned oxide layer 142 as an ion-implantation mask. The implanted N-type impurity ions are driven-in and diffused at a temperature of 1000–1200° C. to form the emitter region 120 and the channel stopper 130. As shown in FIG. 8, a thermal oxide layer grows on the surface of the semiconductor substrate 100 due to the drive-in diffusion process so that the oxide layer 142 used as an ion-implantation mask during the formation of the emitter region 120 and the channel stopper 130 becomes a thicker oxide layer 143. Consequently, the surfaces of the emitter region 120 and the channel stopper 130 are covered with the oxide layer 143.

Figure 9:
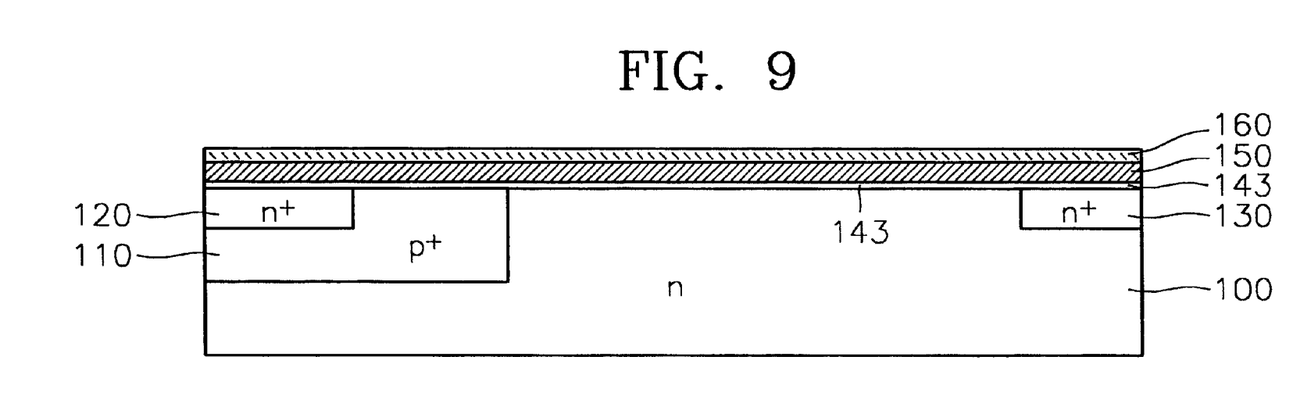

Referring to FIG. 9, a semi-insulating polycrystalline silicon layer 150 is deposited on the oxide layer 143. Here, the step difference of the oxide layer 143 is not illustrated to simplify the drawing. The semi-insulating polycrystalline silicon layer 150 may be deposited by a low pressure CVD (LP-CVD) method. The semi-insulating polycrystalline silicon layer 150 is formed to a thickness of about 5000 Å. Subsequently, a thermal oxide layer 160 is formed on the semi-insulating polycrystalline silicon layer 150 by a thermal oxidation method. The thermal oxide layer 160 is formed by loading the resultant structure having the semi-insulating polycrystalline silicon layer 150 into a tube and injecting oxygen ($O_2$) gas into the tube at a temperature of, for example, about 500–1100° C. The thermal oxide layer 160 is formed to a thickness of 300–3000 Å.

Figure 10:
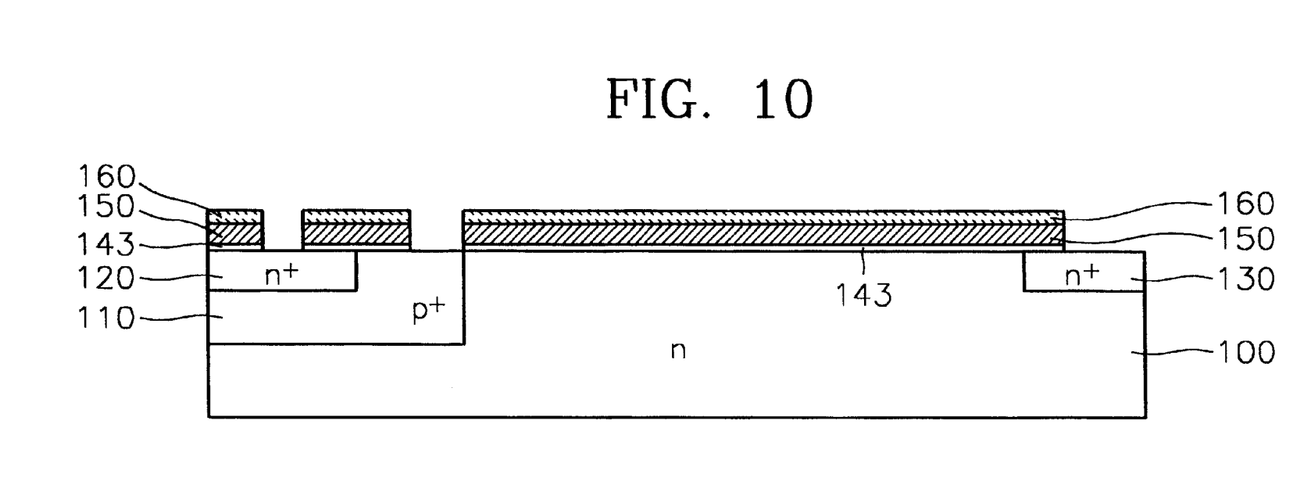

Referring to FIG. 10, a photoresist film (not shown) is deposited on the thermal oxide layer 160. The photoresist film pattern (not shown) is formed by performing an exposing and developing method using a typical photolithography process. The photoresist film pattern has openings which expose some of the surface of the thermal oxide layer 160. Next, the thermal oxide layer 160, the semi-insulating polycrystalline silicon layer 150 and the oxide layer are sequentially etched using the photoresist film pattern as a etching mask to partially expose the surfaces of the base region 110, the emitter region 120 and the channel stopper 130 in the semiconductor substrate 100. The thermal oxide layer 160 and the oxide layer 143 can be etched by a wet etching method so that the etching time can be greatly reduced compared to a conventionally used different kind of layer requiring a dry etching method. The semi-insulating polycrystalline silicon layer 150 is etched by a dry etching method. After completion of the etching process, the photoresist film pattern is removed.

Thereafter, as shown in FIG. 3, a base electrode 170, an emitter 180 and an equipotential electrode 190 are formed on the exposed surfaces of the base regions 110, the emitter region 120 and the channel stopper 130, respectively. Subsequently, a collector electrode 200 is formed on the bottom of the semiconductor substrate 100.

Figure 11:
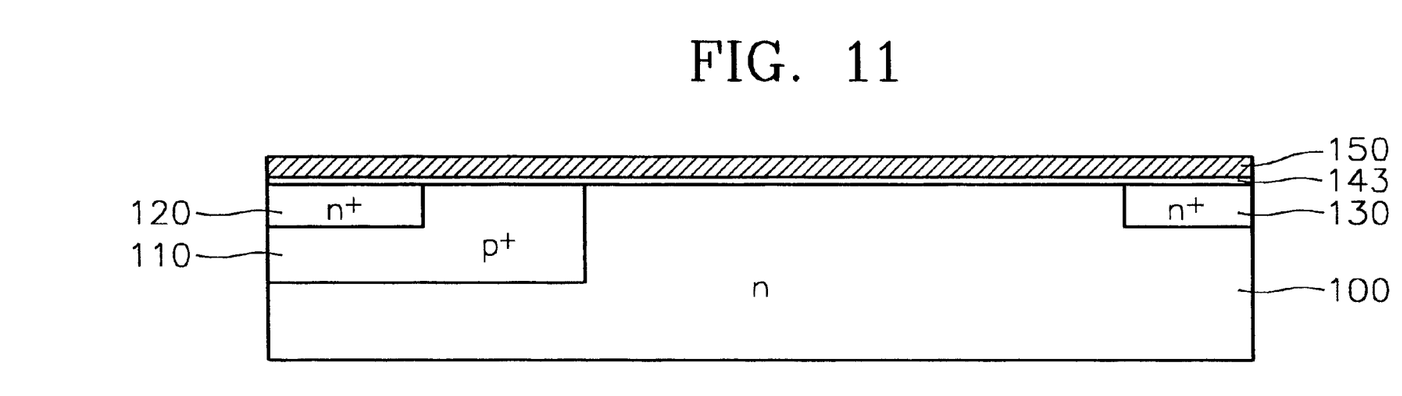
FIGS. 11 through 14 are sectional views illustrating a method for fabricating the high voltage semiconductor device using SIPOS according to the second embodiment of the present invention.

FIGS. 11 through 14 are sectional views illustrating a method for fabricating the high voltage semiconductor device according to the second embodiment. Referring to FIG. 11, after performing the same processes described with reference to FIGS. 5 through 7, a semi-insulating polycrystalline silicon layer 150 is deposited on an oxide layer 143. The semi-insulating polycrystalline silicon layer 150 may be deposited by a low pressure CVD (LP-CVD) method. The semi-insulating polycrystalline silicon layer 150 is formed to a thickness of about 5000 Å.

Figure 12:
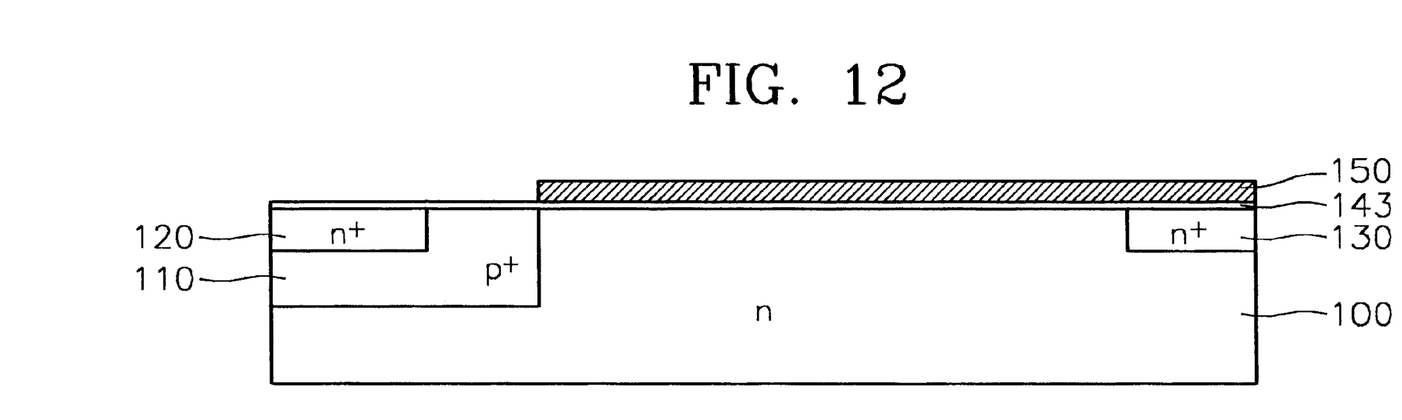

Referring to FIG. 12, a photoresist film (not shown) is deposited on the semi-insulating polycrystalline silicon layer 150. The photoresist film pattern (not shown) is formed by an exposing and developing method using a typical photolithography process. The photoresist film pattern has openings which expose some of the surface of the semi-insulating polycrystalline silicon layer 150. Next, the semi-insulating polycrystalline silicon layer 150 is etched using the photoresist film pattern as a etching mask to partially expose the surface of the oxide layer 143. As a result, the semi-insulating polycrystalline silicon layer 150 is left in a field region, but it is not left in an active region with the exception that it overlaps the edge portion of the base region 110 a little.

Figure 13:
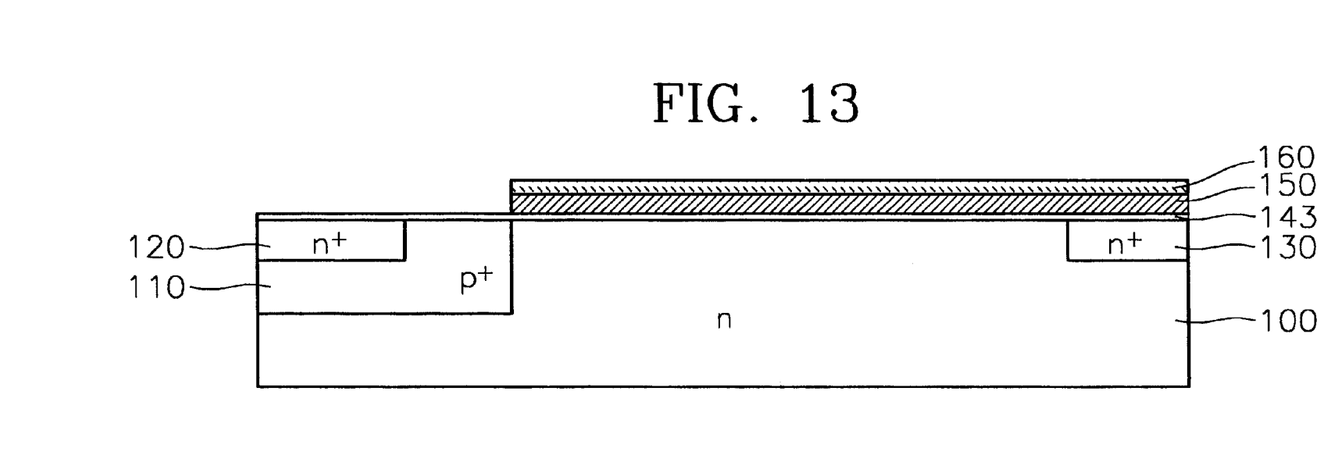

Referring to FIG. 13, a thermal oxide layer 160 is formed on the semi-insulating polycrystalline silicon layer 150 by a thermal oxidation method. The thermal oxide layer 160 is formed by loading the resultant structure having the semi-insulating polycrystalline silicon layer 150 into a tube and injecting oxygen ($O_2$) gas into the tube at a low temperature of, for example, about 500–1100° C. The thermal oxide layer 160 is formed to a thickness of 300–3000 Å.

Figure 14:
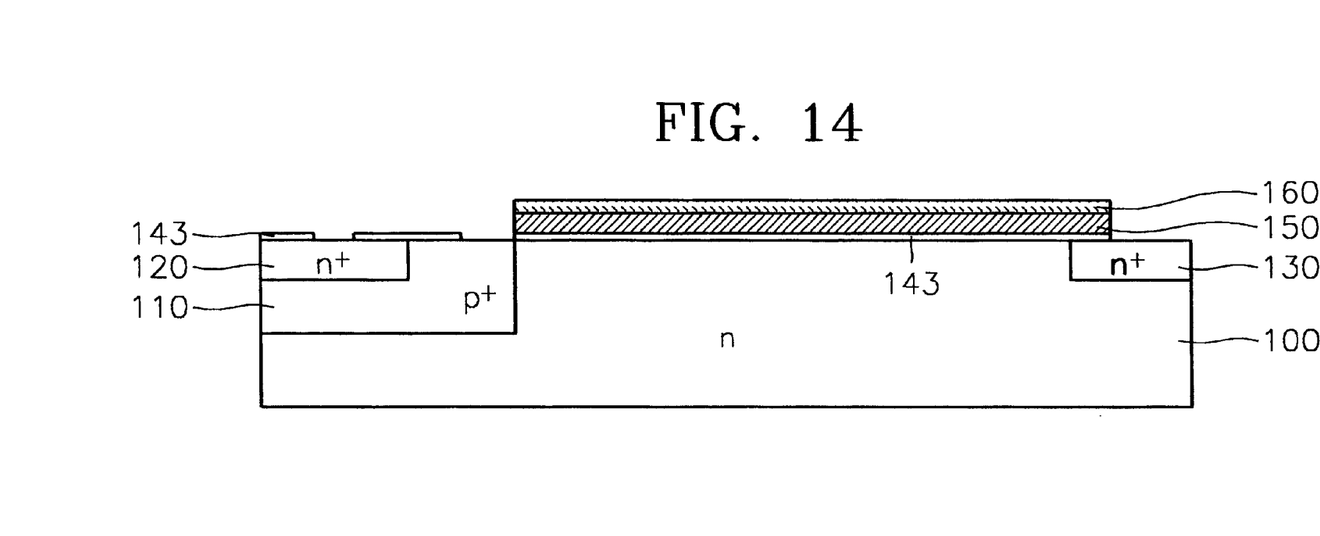

Referring to FIG. 14, a photoresist film (not shown) is deposited on the entire surface of the resultant structure. The photoresist film pattern (not shown) is formed by an exposing and developing method using a typical photolithography process. The photoresist film pattern has openings which expose some of the surface of the oxide layer 143 and the thermal oxide layer 160. Next, an etching process is performed using the photoresist film pattern as a etching mask. As a result, some of the oxide layer 143 is removed in the active region, thereby partially exposing the surfaces of the base region 110 and the emitter region 120. The thermal oxide layer 160, the semi-insulating polycrystalline silicon layer 150 and the oxide layer 143 are partially removed to expose some of the surface of the channel stopper 130. The oxide layer 143 and the thermal oxide layer 160 may be removed by a wet etching method, and the semi-insulating polycrystalline silicon layer 150 may be etched by a dry etching method. Accordingly, the etching time can be reduced compared to the case where instead of the thermal oxide layer, a different layer requiring a dry etching method is used as a protective layer.

Thereafter, as shown in FIG. 4, a base electrode 170, an emitter 180 and an equipotential electrode 190 are formed on the exposed surfaces of the base regions 110, the emitter region 120 and the channel stopper 130, respectively. Subsequently, a collector electrode 200 is formed on the bottom of the semiconductor substrate 100.

As described above, in a high voltage semiconductor device and a method for fabricating the same according to the present invention, a thermal oxide layer having a high density is used as a protective layer so that not only surface protection can be effectively achieved but also a good interface state between a semi-insulating polycrystalline silicon layer and other layers can be obtained, thereby increasing dielectric breakdown voltage and decreasing the amount of leakage current. In addition, the etching process can be easily performed by a wet etching method, thereby simplifying the fabrication and reducing the fabrication time. Since the semi-insulating polycrystalline silicon layer does not exist in an active region, DC gain does not decrease even within a low collector current range, thereby improving the electrical characteristics of devices.

What is claimed is:

1. A method for fabricating a high voltage semiconductor device, comprising the steps of:

forming an oxide layer on a semiconductor substrate of a first conductivity type used as a collector region such that the surface of the semiconductor substrate is partially exposed, the semiconductor substrate having an active region and a field region;

forming a base region of a second conductivity type by ion-implantation;

forming an emitter region of a first conductivity type in the base region and a channel stopper of the first conductivity type in the field region to be separated from the base region by a predetermined distance, using the oxide layer as an ion-implantation mask;

sequentially forming a semi-insulating polycrystalline silicon layer and a thermal oxide layer by a thermal oxidation process on the oxide layer;

partially exposing the surfaces of the emitter region, the base region and the channel stopper by patterning the thermal oxide layer, the semi-insulating polycrystalline silicon layer and the oxide layer; and forming an emitter electrode, a base electrode, an equipotential electrode and a collector electrode to be electrically connected to the emitter region, the base region, the channel stopper and the semiconductor substrate, respectively.

2. The method of claim 1, wherein the semi-insulating polycrystalline silicon layer is formed by a low pressure chemical vapor deposition method to a thickness of about 5000 Å.

3. The method of claim 1, wherein the thermal oxide layer has a thickness of approximately 300–3000 Å.

4. The method of claim 1, wherein in the thermal oxidation process, only oxygen gas is supplied into a tube having a temperature of about 500–1100° C. to form the thermal oxide layer.

5. The method of claim 1, wherein the thermal oxide layer is patterned by a wet etching method when the thermal oxide layer, the semi-insulating polycrystalline silicon layer and the oxide layer are patterned.

6. The method of claim 1, wherein the first conductivity type is an N-type, and the second conductivity type is a P-type.

7. A method for fabricating a high voltage semiconductor device, comprising the steps of:

forming an oxide layer on a semiconductor substrate of a first conductivity type used as a collector region such that the surface of the semiconductor substrate is partially exposed, the semiconductor substrate having an active region and a field region;

forming a base region of a second conductivity type by ion-implantation;

forming an emitter region of a first conductivity type in the base region and a channel stopper of the first conductivity type in the field region to be separated from the base region by a predetermined distance, using the oxide layer as an ion-implantation mask;

forming a semi-insulating polycrystalline silicon layer on the oxide layer and then removing the semi-insulating polycrystalline silicon layer on the active region;

forming a thermal oxide layer on the semi-insulating polycrystalline silicon layer by a thermal oxidation process;

partially exposing the surfaces of the emitter region, the base region and the channel stopper by patterning the thermal oxide layer, the semi-insulating polycrystalline silicon layer and the oxide layer; and forming an emitter electrode, a base electrode, an equipotential electrode and a collector electrode to be electrically connected to the emitter region, the base region, the channel stopper and the semiconductor substrate, respectively.

8. The method of claim 7, wherein the semi-insulating polycrystalline silicon layer is formed by a low pressure chemical vapor deposition method to a thickness of about 5000 Å.

9. The method of claim 7, wherein the thermal oxide layer has a thickness of approximately 300–3000 Å.

10. The method of claim 7, wherein in the thermal oxidation process, only oxygen gas is supplied into a tube having a temperature of about 500–1100° C. to form the thermal oxide layer.

11. The method of claim 7, wherein the thermal oxide layer is patterned by a wet etching method when the thermal oxide layer, the semi-insulating polycrystalline silicon layer and the oxide layer are patterned.

* * * * *